(12) United States Patent
Zhu

(10) Patent No.: US 12,283,520 B2
(45) Date of Patent: Apr. 22, 2025

(54) SELECTIVE DEPOSITION METHOD TO FORM AIR GAPS

(71) Applicant: ASM IP Holding B.V., Almere (NL)

(72) Inventor: Chiyu Zhu, Helsinki (FI)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 18/215,249

(22) Filed: Jun. 28, 2023

(65) Prior Publication Data

US 2023/0360964 A1 Nov. 9, 2023

Related U.S. Application Data

(63) Continuation of application No. 17/379,240, filed on Jul. 19, 2021, now Pat. No. 11,749,562, which is a continuation of application No. 16/685,787, filed on Nov. 15, 2019, now Pat. No. 11,094,582, which is a continuation of application No. 15/836,547, filed on Dec. 8, 2017, now Pat. No. 10,541,173, which is a continuation of application No. 15/205,890, filed on Jul. 8, 2016, now Pat. No. 9,859,151.

(51) Int. Cl.
*H01L 21/768* (2006.01)
*H01L 21/02* (2006.01)

(52) U.S. Cl.
CPC .... *H01L 21/7682* (2013.01); *H01L 21/02164* (2013.01); *H01L 21/02167* (2013.01); *H01L 21/02175* (2013.01); *H01L 21/02271* (2013.01); *H01L 21/0228* (2013.01); *H01L 21/76832* (2013.01)

(58) Field of Classification Search
None
See application file for complete search history.

(56) References Cited

U.S. PATENT DOCUMENTS

| | | | |
|---|---|---|---|
| 6,303,487 B1 * | 10/2001 | Kagamihara | H01L 23/5222 438/355 |
| 7,727,880 B1 | 6/2010 | Chattopadhyay et al. | |
| 7,755,160 B2 | 7/2010 | Gabric et al. | |
| 8,241,992 B2 * | 8/2012 | Clevenger | H01L 21/76835 438/669 |
| 9,305,836 B1 | 4/2016 | Gates et al. | |
| 9,368,572 B1 * | 6/2016 | Cheng | H01L 29/66742 |
| 2005/0161696 A1 * | 7/2005 | Yuri | H01L 33/16 257/E33.068 |
| 2007/0218677 A1 * | 9/2007 | Engelhardt | H01L 21/7682 438/618 |
| 2008/0157157 A1 | 7/2008 | Tonomura et al. | |
| 2008/0185722 A1 * | 8/2008 | Liu | H01L 21/76849 257/E23.151 |
| 2010/0270541 A1 * | 10/2010 | Liu | H01L 27/1255 438/34 |
| 2010/0270682 A1 * | 10/2010 | Aguado Granados | H01L 23/5222 257/774 |

(Continued)

*Primary Examiner* — Bilkis Jahan
(74) *Attorney, Agent, or Firm* — Snell & Wilmer L.L.P.

(57) ABSTRACT

A method for depositing a film to form an air gap within a semiconductor device is disclosed. An exemplary method comprises pulsing a metal halide precursor onto the substrate and pulsing an oxygen precursor onto a selective deposition surface. The method can be used to form an air gap to, for example, reduce a parasitic resistance of the semiconductor device.

20 Claims, 12 Drawing Sheets

(56) References Cited

U.S. PATENT DOCUMENTS

| | | | |
|---|---|---|---|
| 2012/0319279 A1* | 12/2012 | Isobayashi | H01L 23/53238 |
| | | | 438/653 |
| 2013/0323930 A1* | 12/2013 | Chattopadhyay | ........................... |
| | | | H01L 21/76829 |
| | | | 156/345.26 |
| 2014/0191401 A1 | 7/2014 | Fischer | |
| 2015/0228572 A1 | 8/2015 | Yang et al. | |
| 2018/0226289 A1* | 8/2018 | Bielefeld | H01L 21/76826 |

* cited by examiner

SELECTIVE DEPOSITION METHOD TO FORM AIR GAPS

CROSS-REFERENCE TO RELATED APPLICATION

This application is a continuation of, and claims priority to, U.S. patent application Ser. No. 17/379,240 filed Jul. 19, 2021 titled SELECTIVE DEPOSITION METHOD TO FORM AIR GAPS; which is a continuation of U.S. patent application Ser. No. 16/685,787 filed Nov. 15, 2019 (now U.S. Pat. No. 11,094,582 issued Aug. 17, 2021); which claims priority to and the benefit of, U.S. patent application Ser. No. 15/836,547, filed on Dec. 8, 2017 (now U.S. Pat. No. 10,541,173 issued Jan. 21, 2020); which is a continuation of U.S. patent application Ser. No. 15/205,890 filed Jul. 8, 2016 (now U.S. Pat. No. 9,859,151 issued on Jan. 2, 2018), all of which are incorporated herein by reference.

FIELD OF INVENTION

The present disclosure generally relates to processes for manufacturing electronic devices. More particularly, the disclosure relates to selectively forming films through atomic layer deposition (ALD) or chemical vapor deposition (CVD). Specifically, the disclosure discloses methods to form ALD or CVD films that can be used to form an air gap.

BACKGROUND OF THE DISCLOSURE

Generally, deposition of films has taken place in a manner such that layers are grown from the bottom in an upward direction. For example, a film grown on a wafer is often grown in a direction vertical to the wafer's surface. Other films may be grown vertically on a microstructure surface. Some examples of features created in this manner include trench filling, step formation, or FinFET features, for example.

Air gaps are features with applicability in film deposition. U.S. Pat. No. 7,304,388 to Dubin et al. discloses air gaps that are created by first forming a sacrificial interlayer dielectric and decomposing it. The formation may involve an etching step, which may cause problems and decrease the performance of the device. The formation may also involve a deposition step for protecting liners, metal or metallic surfaces, thus decreasing the size of the air gap and the performance of the device. For example, International Publication No. WO 2013/101096 to Fischer discloses air gap formation with a hood layer. The air gap formation may also include an etching step. Air gaps may be used both in back end of line (BEOL) processing or front end of line processing. Two examples of applications for air gaps include air gaps in metallization, such as Cu metallization, or air gaps in NAND memories.

As a result, a method for selectively forming an air gap through ALD or CVD processes resulting in increased performance is desired.

SUMMARY OF THE DISCLOSURE

In accordance with at least one embodiment of the invention, a method of forming an air gap for a semiconductor device through selective deposition is disclosed. The method comprises: providing a substrate for processing in a reaction chamber; providing a first surface for selectively depositing a film, wherein at least a part of the first surface is substantially vertical; and selectively depositing a film through a deposition method on the first surface in at least a horizontal direction, the film not being deposited on a second surface, wherein the second surface differs from the first surface; wherein selectively depositing the film defines in part an air gap.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE DRAWING FIGURES

These and other features, aspects, and advantages of the invention disclosed herein are described below with reference to the drawings of certain embodiments, which are intended to illustrate and not to limit the invention.

Figure 1:
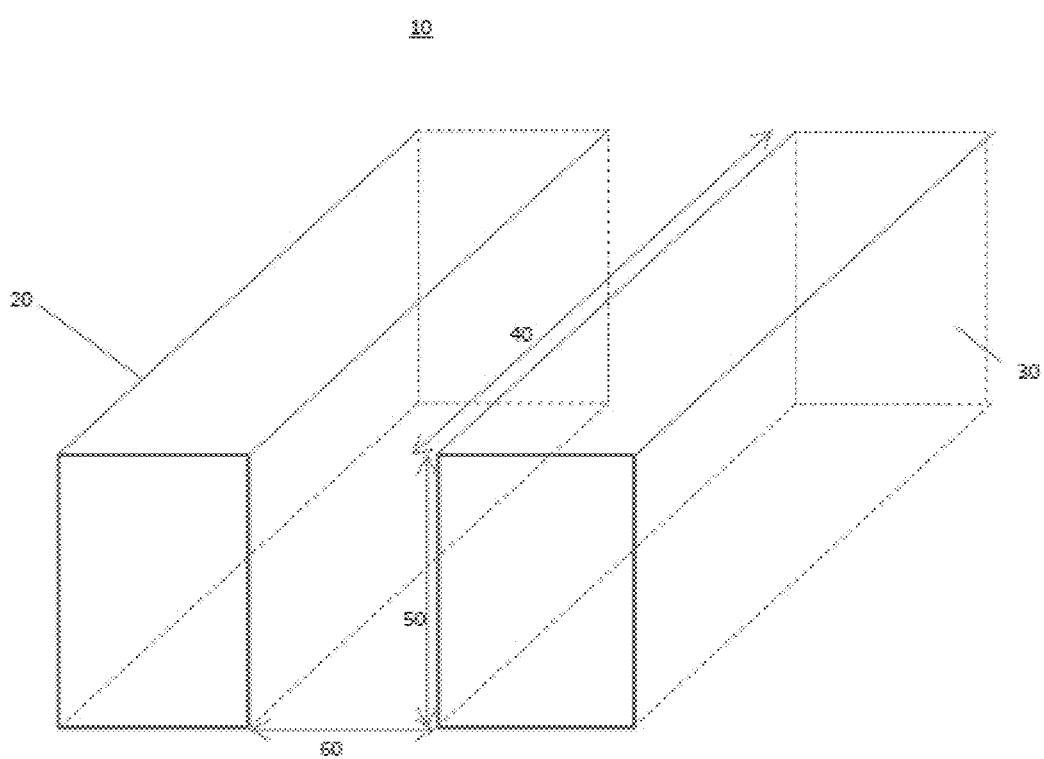
FIG. 1 is a perspective view of a semiconductor device in accordance with at least one embodiment of the invention.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

Selective deposition is desirable in order to grow particular features for a variety of applications. One particular feature, air gaps, has been used in 14 nm nodes, which currently is the smallest node size manufactured. Air gaps created in the 14 nm node may have, for example, a height of approximately 140 nm and a width of approximately 50 nm. This gap can be formed in a trench of approximately 180 nm in height, the trench herein meaning the space in between the metallization lines. The area of the air gap may be approximately 6,500 nm$^2$, while the trench can have an area of 19,700 nm$^2$. The volume of the air gap could be in the range of 1,625,000-32,500,000 nm$^3$, while the trench could have a volume of 4,925,000-98,500,000 nm$^3$. The air gap can be approximately 33% of the size of the trench.

Embodiments according to the invention can result in a larger air gap in that it can be a greater percentage of the trench, such as 50-60%, for example. The size of the air gap may be more than about 35%, more than about 45%, more than about 50%, more than about 60%, more than about 70%, or more than about 80% of the size of the trench or the space between the metallization lines.

One of ordinary skill in the art would understand that different sizes for the air gap may be possible. For example, the height of the air gap may range between about 10 to about 500 nm, between about 20 to about 300 nm, between about 30 to about 200 nm. Also, the width of the air gap may range between about 5 to about 250 nm, preferably between about 10 to about 200 nm, or more preferably between about 20 to about 100 nm. Also, the width of the air gap may be less than about 50 nm, less than about 30 nm, less than about 20 nm or in some instances less than to about 10 nm. The width can be considered to be measured to a direction of the smaller dimension between the features, for example, the width between metallization lines, the longest dimension of the metallization lines being cross-sectional to width (i.e., the smaller dimension).

From this, the cross-sectional area of the air gap may range between 50-125,000 nm$^2$, preferably between about 100 to about 50,000 nm$^2$, or more preferably between about 200 to about 20,000 nm$^2$. The cross-sectional area of the air gap herein can be considered to be a cross-sectional area of the air gap between the features of device. The area can be considered to be measured to a direction of the smallest dimension between the features, for example, the area between metallization lines, the longest dimension of the metallization lines being cross-sectional to the area. Furthermore, the size of the air gap in relation to the trench size may range between about 30-80%. Also, the volume of the air gap could be in the range from about 2,500 to about 5,000,000,000 nm$^3$, preferably from about 10,000 to about 500,000,000 nm$^3$, or more preferably from about 50,000 to about 50,000,000 nm$^3$.

FIG. 1 is schematic and simplified for the purpose of illustrating the exemplary dimensions. FIG. 1 illustrates a semiconductor device 10 in accordance with at least one embodiment of the invention. The semiconductor device 10 comprises a first metallization line 20 and a second metallization line 30. The first metallization line 20 and the second metallization line 30 may comprise a material, such as copper or other appropriate metal. A gap may exist between the first metallization line 20 and the second metallization line 30. The gap may have a length 40, a height 50, and a width 60. In some embodiments, the air gap may be formed inside the gap and it may have a length, a height, and a width smaller than the length 40, the height 50, and the width 60 illustrated in the FIG. 1. In some embodiments, the cross-sectional area of the air gap may be measured or calculated by using the height and the width, of which directions are the same than height 50 and width 60 of the air gap formed inside the gap. In some embodiments, the width 60 may be considered to be the smallest or smaller dimension between the features. In some embodiments, the height 50 may be considered to be the smallest or smaller dimension between the features.

Advantages gained from a larger air gap may include improved performance, and reducing the effective k-value of the material in between the lines. For example, the dielectric constant of low-k materials may be approximately 2.52, but the dielectric constant of air is 1. Reduction of the dielectric constant through replacement of the low-k material with air reduces the Resistive-capacitive (RC) delay. In addition, the replacement may result in increased processing speed, use of less current, and reduction of operating temperature and parasitic resistance. In some embodiments, the structure having air gap may have a performance similar to a material with a k-value of less than about 3.9, less than about 3.6, less than about 3.3, less than about 3, less than about 2.7, less than about 2.5, and in some instances, the k-value could be less than about 2.3 or even less than about 2.0 when the material would be considered to replace the air gap.

Figures presented herein are simplified and do not necessarily illustrate all layers, structures or features of the exemplary integrated circuits or structures that can form part on an integrated circuit.

Figure 2A:
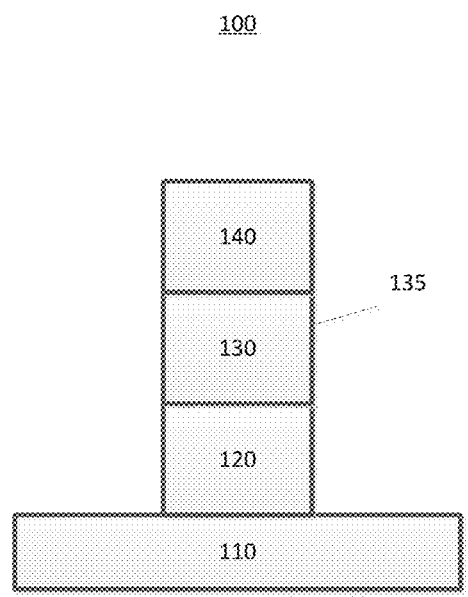
FIGS. 2A and 2B are cross-sectional views of a semiconductor device in accordance with at least one embodiment of the invention.

FIG. 2A illustrates a semiconductor device 100 in accordance with at least one embodiment of the invention. The semiconductor device 100 may include a wafer 110, a first layer 120, a second layer 130, and a capping layer 140. The wafer 110 may comprise semiconductor material, such as silicon, silicon germanium or compound semiconductors such as III-V or II-VI materials. The first layer 120 may be a metal layer on top of the wafer 110, and may comprise metal or metallic materials, such as copper or insulating or dielectric material, such as silicon dioxide based materials or low-k materials. In some embodiments, the first layer 120 may comprise silicon and oxygen, for example, silicon dioxide. In some embodiments, the first layer 120 may not comprise metal. In some embodiments, the first layer 120 may comprise semi-metal material. Additional layers may exist between the first layer 120 and the substrate 110; for example, there may be multiple metallization layers or transistor layers or contact layers disposed between the first layer 120 and the substrate 110. The second layer 130 may be formed on the first layer 120, and may comprise materials comprising metal, such as aluminum nitride tungsten, tungsten oxide or other metallic, metal or insulating material. In some instances, the second layer 130 may be of a different material than the first layer 120. In some embodiments, the second layer 130 may comprise a metal or metallic surface. In some embodiments, the second layer 130 may not comprise a semi-metal. In some embodiments, the second layer 130 may comprise metal and oxygen, such as metal oxide.

The capping layer 140 may be formed on the second layer 130 and may comprise silicon-based material, such as silicon dioxide, silicon nitride or mixtures thereof. The capping layer 140 may cover portions of the second layer 130, leaving a particular portion of the second layer 130 exposed. The capping layer 140 may be made of the same material as the first layer 120. In some embodiments, the capping layer 140 may comprise silicon and oxygen, for example, silicon dioxide. In some embodiments, the capping layer 140 may not comprise metal. In some embodiments, the capping layer 140 may comprise a semi-metal. It is on the exposed portion (e.g., a surface or vertical portion 135) of the second layer 130 on which selective deposition may take place.

Figure 2B:
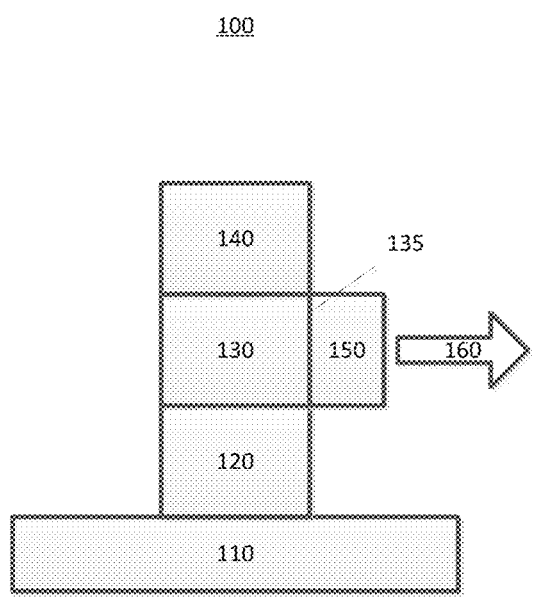

FIG. 2B illustrates the semiconductor device 100 in accordance with at least one embodiment of the invention. Upon an exposed portion of the second layer 130 (e.g., surface 135), a film 150 is deposited substantially horizontally along a direction 160 via deposition method, such as ALD, CVD (e.g., cyclic or sequential CVD), or any other suitable chemical and vapor phase based deposition method resulting in selective deposition. The film 150 deposited may comprise an insulating or dielectric material (for example, silicon oxide ($SiO_2$)), metal oxide materials, transition metal oxides (for example, niobium oxide ($Nb_2O_5$)), or another low-k material.

For a film 150 formed of metal oxide, the following process may be used. First a surface (e.g., surface 135) to deposit the film 150 on may be provided. Second, a pulsing step of a metal precursor such as metal halide, may take place. An example of a metal halide may be a transition metal halide, such as niobium fluoride, niobium chloride, tantalum fluoride, tantalum chloride, molybdenum fluoride, molybdenum chloride, tungsten fluoride, tungsten fluoride, vanadium fluoride, vanadium chloride, chromium fluoride, or chromium chloride. In some embodiments, the metal halide may be $NbCl_5$ or $TaCl_5$. The pulsing step may have a temperature ranging between 20 and 600° C., preferably between 100 and 500° C., preferably between 150 and 400° C., and preferably between 175 and 375° C. The pulsing step may have a duration ranging between 0.01 and 120 seconds, preferably between 0.025 and 20 seconds, preferably between 0.05 and 10 seconds, and preferably between 0.1 and 5 seconds.

Third, a pulsing step of an oxygen source, such as water, may take place for example. Other oxygen sources may include oxygen ($O_2$), ozone ($O_3$), hydrogen peroxide ($H_2O_2$), atomic oxygen (O), oxygen radicals, or oxygen plasma, among others. The pulsing step may have a temperature ranging between 20 and 600° C., preferably between 100 and 500° C., preferably between 150 and 400° C., and preferably between 175 and 375° C. The pulsing step may have a duration ranging between 0.01 and 120 seconds, preferably between 0.025 and 20 seconds, preferably between 0.05 and 10 seconds, and preferably between 0.1 and 5 seconds.

After the pulsing steps, a purging step may take place to expunge any excess precursor. In addition, the pulsing steps may be repeated to form a film of a desired thickness.

Figure 3A:
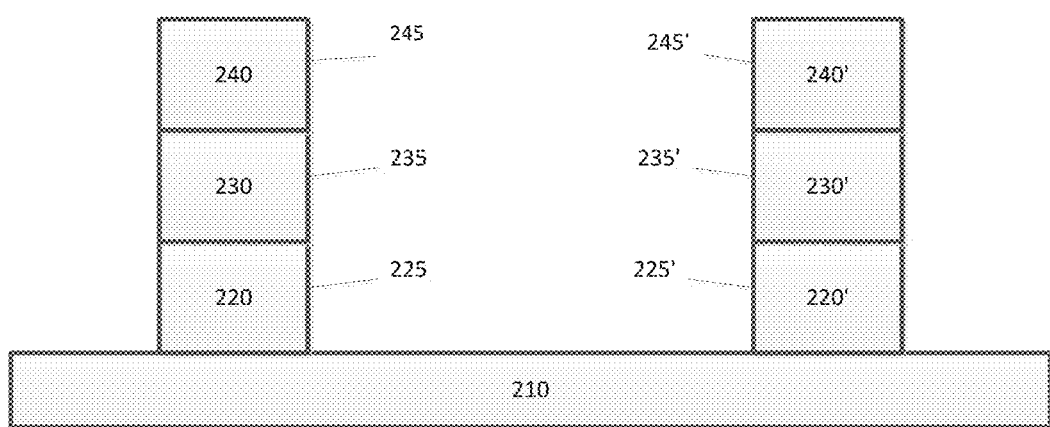
FIGS. 3A, 3B, 3C and 3D are cross-sectional views of a semiconductor device in accordance with at least one embodiment of the invention.

FIG. 3A illustrates a semiconductor device 200 in accordance with at least one embodiment of the invention. The semiconductor device 200 includes a wafer 210 and a first column comprising a first layer 220 comprising a first surface 225, a second layer 230 comprising a second surface 235, and a capping layer 240 comprising a third surface 245. The semiconductor device 200 may also include a second column comprising a first layer 220' comprising a fourth surface 225', a second layer 230' comprising a fifth surface 235', and a capping layer 240' comprising a sixth surface 245'. Surfaces 225, 235, 245, 225', 235', and 245' can be vertical portions or comprise vertical portions. The wafer 210 may comprise silicon, silicon germanium, or another III-V material. The first layer 220 and the first layer 220' may be a metal layer on top of the wafer 210, and may comprise copper or tungsten, for example. Additional layers may exist between the first layers 220 and 220' and the substrate 210; for example, there may be multiple metallization layers disposed between the first layers 220 and 220' and the substrate 210. The second layer 230 and the second layer 230' may be formed on the first layer 220 and the first layer 220', and may comprise aluminum nitride, silicon nitride (SiN), or silicon carbon nitride (SiCN).

The capping layer 240 and the capping layer 240' may be formed on the second layer 230 and the second layer 230'. The capping layer 240 and the capping layer 240' may comprise silicon oxide, niobium oxide ($Nb_2O_5$), or another low-k material. The capping layer 240 and the capping layer 240' may cover portions of the second layer 230 and the second layer 230', leaving a particular portion exposed (e.g., surfaces 235, 235'). It is on the exposed portion (e.g., surface 235, 235') of the second layer 230 and the second layer 230' on which selective deposition may take place.

Figure 3B:
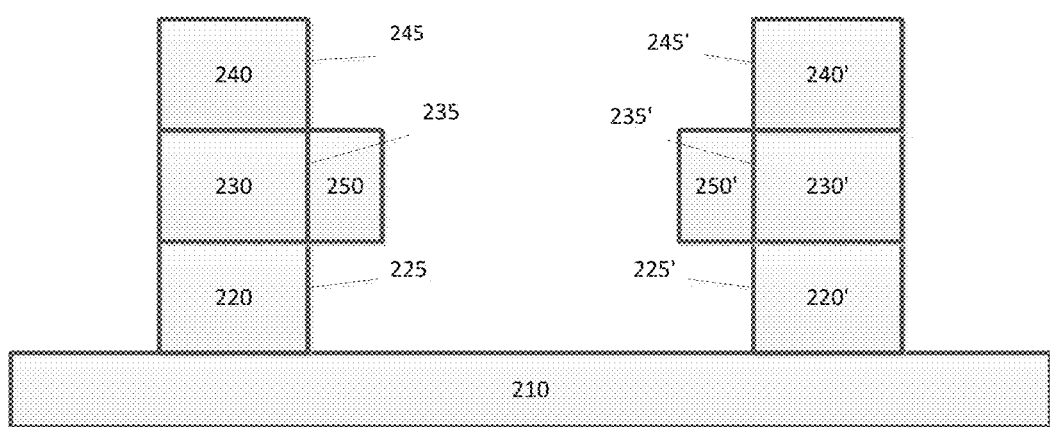

FIG. 3B illustrates the semiconductor device 200A, which includes structure 200, in accordance with at least one embodiment of the invention. Upon an exposed portion (e.g., surfaces 235, 235') of the second layer 230 and the second layer 230', a film 250 and a film 250' are deposited substantially horizontally via deposition method, such as ALD, CVD, or any other suitable deposition method resulting in selective deposition. The film 250 deposited may comprise silicon oxide ($SiO_2$), niobium oxide ($Nb_2O_5$), or another low-k material. The steps to form the film 250, 250' may be similar to those described in relation to FIG. 2B.

Figure 3C:
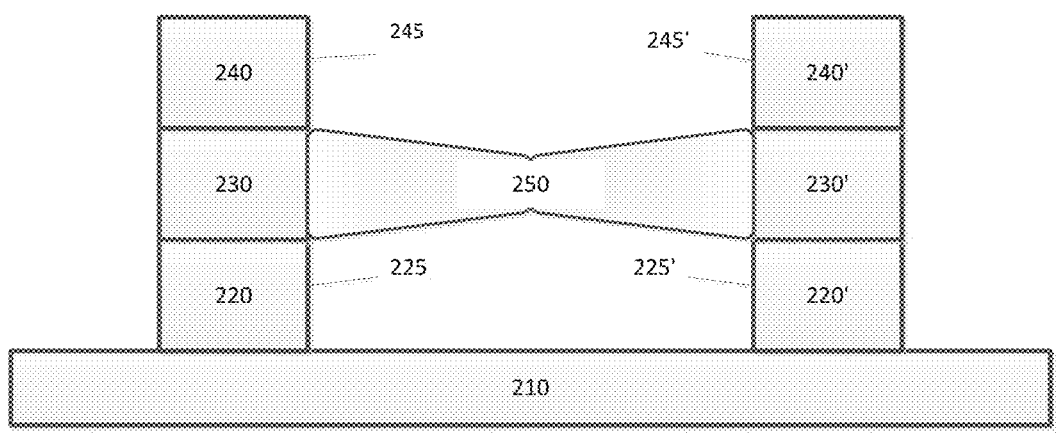

FIG. 3C illustrates a semiconductor device 200B, formed from structure 200A, in accordance with at least one embodiment of the invention. As the substantially horizontal deposition takes place, a film 250 (merged with film 250') may be formed to bridge the first column with the second column. A shape of the film 250 may be narrower in the middle due to crystalline alignment or due to deposition process itself. For example, before closing of the gap 250, there may be only a narrow pathway from the air gap to outside environment, which may be difficult to purge in reasonable time before the next precursor pulse. Without being bound to any theory, it may cause some CVD reactions to take place on and around the narrow pathway and it may cause closing of the gap and affect the shape of the film 250. However, other shapes for the film 250 are possible, including spherical or semispherical.

Figure 3D:
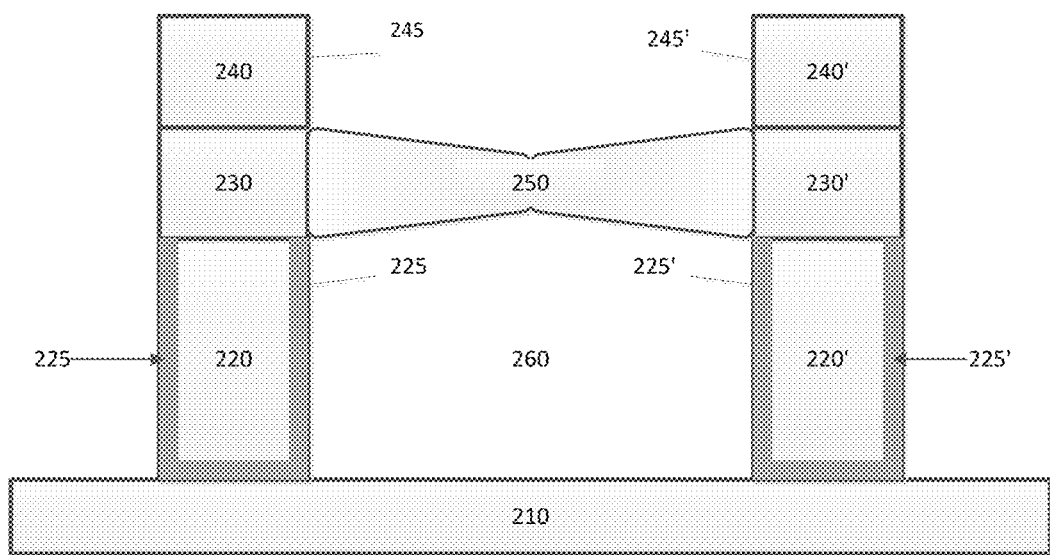

FIG. 3D illustrates a semiconductor device 200C in accordance with at least one embodiment of the invention. The first layer 220 may have a liner 225, while the first layer 220' may have a liner 225'. The liner 225 and the liner 225' may comprise titanium nitride (TiN), tantalum nitride (TaN), tungsten nitride (WN), tungsten (W), tantalum (Ta), titanium (Ti), or other appropriate metallic material. The liner 225 and the liner 225' may generally have the features of good conductivity, effective barrier properties, and good adhesion. Surfaces 225, 225' may comprise the liner material. As a result of the horizontal deposition, an air gap 260 may be formed. The air gap 260 serves as a replacement for a low-k dielectric material that would have been in its place.

Figure 4A:
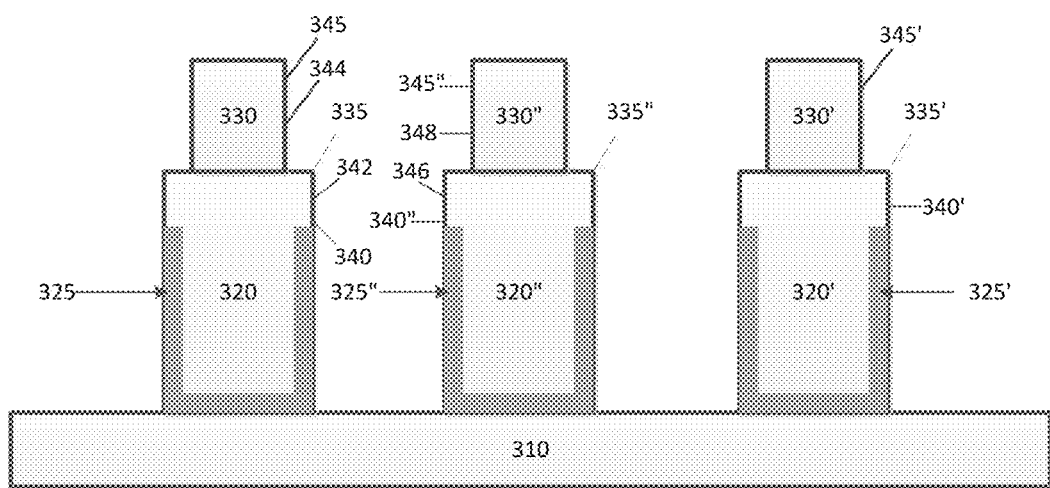
FIGS. 4A, 4B, 4C and 4D are cross-sectional views in accordance with at least one embodiment of the invention.

FIG. 4A illustrates a semiconductor device 300 in accordance with at least one embodiment of the invention. The semiconductor device 300 includes a wafer 310. The wafer 310 may comprise silicon, silicon germanium, or other III-V materials. Disposed on the wafer 310 are a plurality of first layers 320, 320', and 320". The first layers 320, 320', and 320" may comprise copper, tungsten, tantalum, or titanium, for example, and may be metallization lines in an integrated circuit. First layer 320 can include a first surface 340 and a first substantially vertical portion 342, first layer 320" can include a third surface 340" and a third substantially vertical portion 346, and first layer 320' can include a fifth surface 340'. Covering a portion of the first layers 320, 320', and 320" (e.g., a portion of first surface 340, a portion of third surface 340", and a portion of fifth surface 340') are a plurality of liners 325, 325', and 325". The liners 325, 325', and 325" may comprise titanium nitride (TiN), tantalum nitride (TaN), tungsten nitride (WN), tungsten (W), tantalum (Ta), titanium (Ti), or other appropriate metallic material.

A plurality of second layers 330, 330', and 330" may be formed on the first layers 320, 320', and 330". The second layers 330, 330', and 330" may comprise aluminum nitride, silicon nitride (SiN), or silicon carbon nitride (SiCN), for example. Second layer 330 can include a second surface 345 and a second substantially vertical portion 344, second layer 330" can include a fourth surface 345" and a fourth substantially vertical portion 348, and second layer 330' can include a sixth surface 345'.

Figure 4B:
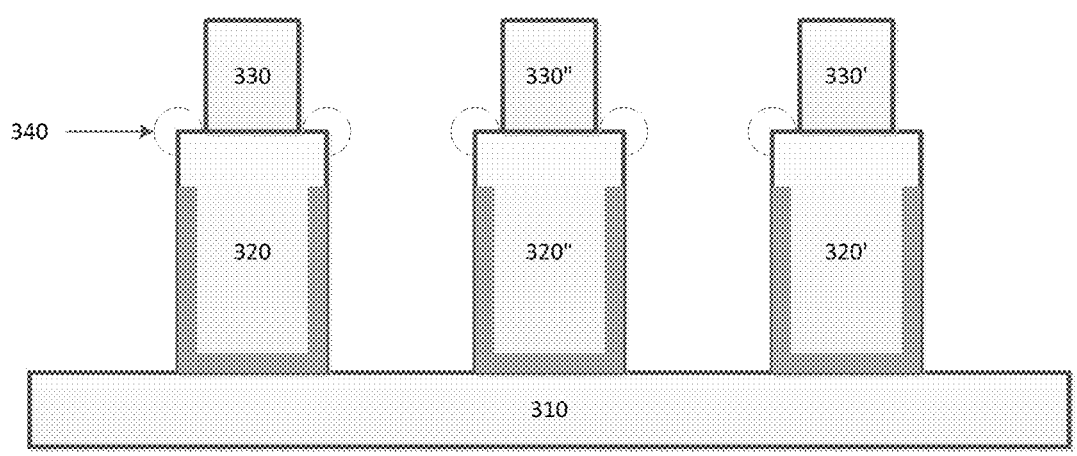

FIG. 4B illustrates the semiconductor device 300A in accordance with at least one embodiment of the invention. A portion (e.g., surfaces 335, 335', and 335', which can comprise vertical portions) of the first layers 320, 320', and 320" is not covered by the liners 325, 325', and 325" and the second layers 330, 330', and 330". It is on this exposed portion of the first layers 320, 320' and 320" that a plurality of films 340 may be formed. The plurality of films 340 may be formed through ALD, CVD, or any other suitable deposition method resulting in selective deposition.

The films 340 may comprise silicon oxide ($SiO_2$), niobium oxide ($Nb_2O_5$), or another low-k material. The steps to form the film 340 may be similar to those described in relation to FIGS. 1B and 2B. The selective deposition takes place such that the film 340 forms on the exposed portions of the first layers 320, and 320', and 320". The film 340 would not form on the liners 325, 325', and 325" or the second layers 330, 330', and 330".

Figure 4C:
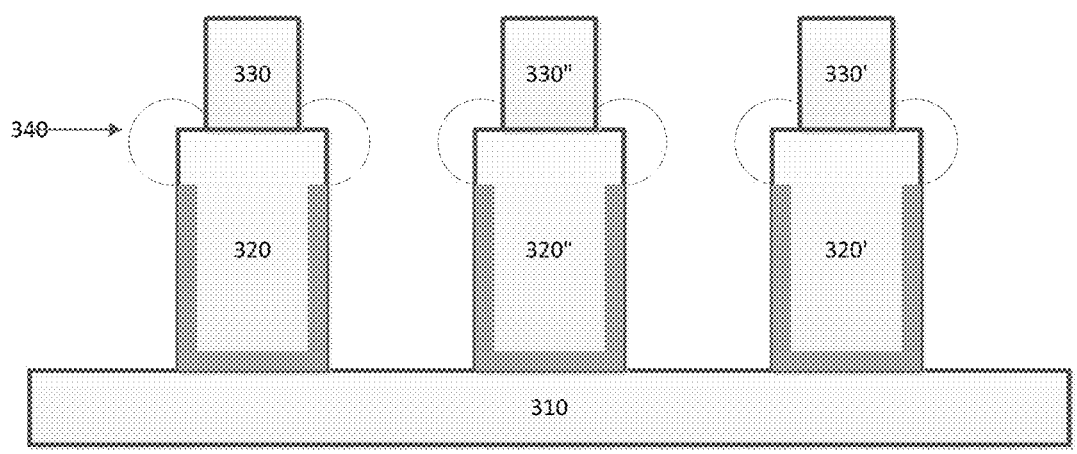

FIG. 4C illustrates the semiconductor device 300B in accordance with at least one embodiment of the invention. The films 340 may grow to a point that it covers all of the exposed portions of the first layers 320, 320', and 320". The film 340 may first be grown in a conformal manner, but then grow in a non-conformal manner close to a surface of an opening of the trench or a space between the column stacks. The trench may be closed by the film 340 by a varying degree. For example, a percentage closure of the trench by the film 340 may be more than about 20%, more than about 40%, more than about 60%, or more than about 80%. Such may be also reflected by the amount of the film 340 deposited. For example, the film 340 may comprise more than about 1 nm of deposition, more than about 3 nm of deposition, more than about 5 nm of deposition, more than about 10 nm of deposition, or more than about 20 nm of deposition.

Figure 4D:
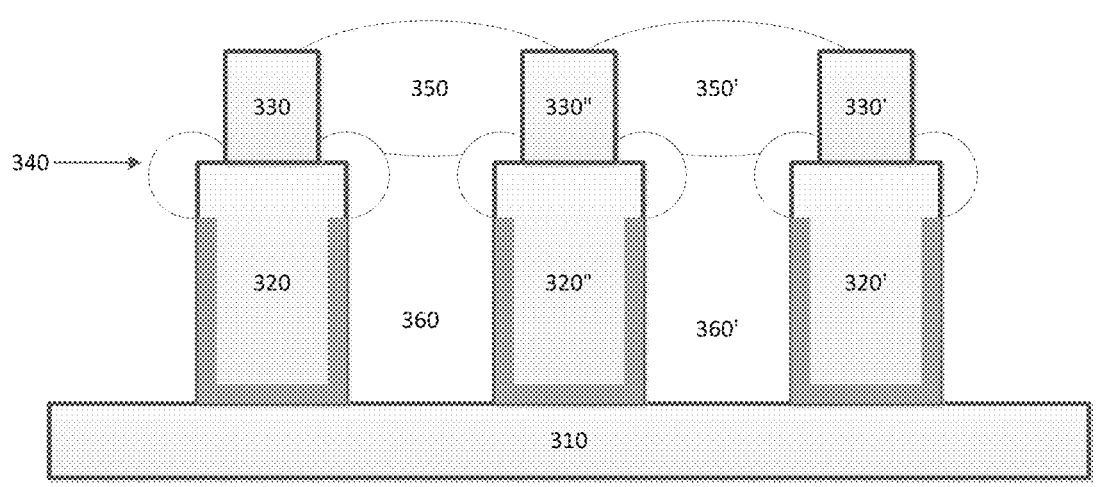

FIG. 4D illustrates the semiconductor device 300C in accordance with at least one embodiment of the invention. After the film 340 is formed, a first dielectric layer 350 and a second dielectric layer 350' may be formed through a CVD process with parameters resulting in a non-conformal film growth, such as non-conformal plasma enhanced chemical vapor deposition (PECVD) of a silicon oxide-based material, for example. The first dielectric layer 350 and the second dielectric layer 350' may comprise silicon based materials such as silicon dioxide ($SiO_2$), silicon carbonitride (SiCN), or a low-k material, for example. The first dielectric layer 350 and the second dielectric layer 350' may be formed to create a first air gap 360 and a second air gap 360'. In addition, the dielectric layers 350 and 350' may be formed on the top of the second layers 330, 330', and 330".

As shown in FIG. 4D, multiple air gaps may be formed between formed stacked layers. Gaps may be less than 200 nm, preferably less than 100 nm, more preferably less than 75 nm, and more preferably less than 50 nm. A smaller gap may be preferred as being better for ALD processing. In some embodiments, CVD processing may also be applied. By increasing the empty space of the air gaps, improved performance of the device may result.

As mentioned above, the selectivity may be expressed as the ratio of material formed on the first surface (A) minus the amount of material formed on the second surface (B) to amount of material formed on the first surface (A) (i.e., selectivity can be given as a percentage calculated by [(deposition on first surface)−(deposition on second surface)]/(deposition on the first surface) or [(A−B)/A]). Preferably, the selectivity may be above about 50%, above about 70%, above about 80%, above about 90%, above about 95%, above about 98%, above about 99% or about 100%. In some cases, selectivity above 80% may be acceptable for certain applications. In some cases, selectivity above 50% may be acceptable for certain applications. In some embodiments, the deposition temperature may be selected such that the selectivity is above about 95%. In some embodiments, the deposition temperature may be selected such that a selectivity of about 100% is achieved.

In some embodiments the thickness of the film that is selectively deposited is less than about 500 nm, less than about 250 nm, less than about 100 nm, less than about 50 nm or less than about 25 nm. In some embodiments, the thickness of the film that is selectively deposited may range from about 3 nm to about 200 nm or from about 5 nm to about 50 nm. However, in some cases a desired level of selectivity, for example more than 80%, or more than 90%, is achieved with the thicknesses of the selectively deposited film being over about 5 nm, over about 10 nm, over about 15 nm or over about 20 nm.

Figure 5:
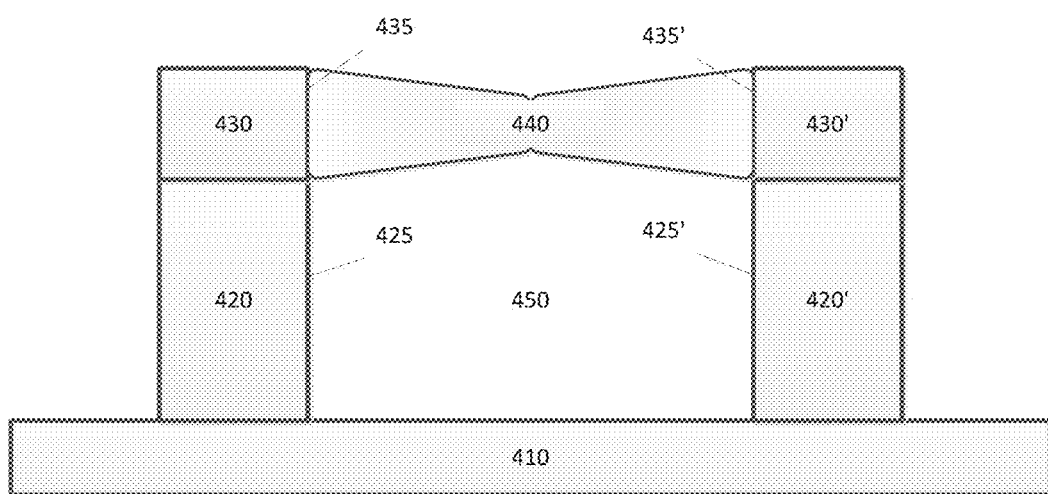
FIG. 5 is a cross-sectional view in accordance with at least one embodiment of the invention.

In some embodiments described above, one or more pretreatment and/or passivation processes or treatments of one or more of the surfaces of the substrate may be performed before selectively depositing the film. Passivation or pretreatments may enhance the selectivity and the growth on the desired surface and may decrease or block, in some instances almost completely block the growth on another surface. FIG. 5 illustrates such a structure in accordance with at least one embodiment of the invention. The structure may comprise a substrate 410, upon which a first column comprising a first layer 420 comprising a first surface comprising a first vertical portion 425 and a second layer 430 comprising a second surface comprising a second vertical portion 430 and a second column comprising a first layer 420' comprising a third surface comprising a third vertical portion and a second layer 430' comprising a fourth surface comprising a fourth vertical portion is formed. The first layer 420 and the first layer 420' may be subject to a pre-treatment or passivation step prior to the formation of a horizontal selective film 440. Once the formation of the horizontal selective film 440 is complete, an air gap 450 may be formed.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

The invention claimed is:

1. A semiconductor device, the device comprising:
   a first column disposed on a surface of a substrate, wherein the first column comprises a first layer and a second layer, wherein the first layer is disposed beneath the second layer;
   a second column disposed on a surface of a substrate, wherein the second column comprises a third layer and a fourth layer, wherein the third layer is disposed beneath the fourth layer;
   a film connecting the second layer to the fourth layer such that the film defines an air gap beneath the film and between the first and second column,
   wherein the film is in direct contact with the second layer and the fourth layer, and wherein the second layer and the fourth layer comprise a material comprising a metal element.

2. The device of claim 1, wherein the second layer and fourth layer comprise the same material.

3. The device of claim 1, wherein the first layer and the third layer comprise a metal or a metallic material.

4. The device of claim 1, wherein the first layer and the third layer comprise silicon and oxygen.

5. The device of claim 1, wherein the air gap is in direct contact with the first layer and the third layer.

6. The device of claim 1, wherein the second layer and the fourth layer comprise a metal or metallic material.

7. The device of claim 1, further comprising:
   a first capping layer disposed above the second layer; and
   a second capping layer disposed above the fourth layer.

8. The device of claim 7, wherein the first capping layer comprises at least one of silicon dioxide and silicon nitride.

9. The device of claim 7, wherein the first layer and the first capping layer comprise the same material.

10. The device of claim 1, wherein the film comprises an insulating or dielectric material.

11. The device of claim 10, wherein the film comprises silicon dioxide.

12. The device of claim 10, wherein the film comprises a metal oxide.

13. The device of claim 12, wherein the film comprises a niobium oxide.

14. The device of claim 1, wherein the first layer comprises a liner, wherein the liner is disposed on a surface of the first layer adjacent to the air gap.

15. The device of claim 1, wherein the air gap is greater than 35% of a trench, wherein the trench is defined by a space between the first column and the second column.

16. The device of claim 1, wherein the air gap has a height between about 10 nm and about 500 nm.

17. The device of claim 1, wherein the air gap has a width between about 5 nm and about 250 nm.

18. The device of claim 1, wherein the device has a dielectric constant less than about 3.9.

19. The device of claim 1, wherein the film has a thickness between about 3 nm to about 200 nm.

20. The device of claim 1, wherein the film has a thickness between about 5 nm to about 50 nm.

* * * * *